United States Patent
Hsiao et al.

(10) Patent No.: US 10,483,667 B2
(45) Date of Patent: Nov. 19, 2019

(54) ELECTRONIC DEVICE AND RADAR DEVICE

(71) Applicant: Wistron NeWeb Corp., Hsinchu (TW)

(72) Inventors: Hsin-Lung Hsiao, Hsinchu (TW); Chien-Chung Tseng, Hsinchu (TW); Min-Jung Wu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 433 days.

(21) Appl. No.: 15/091,258

(22) Filed: Apr. 5, 2016

(65) Prior Publication Data

US 2016/0372849 A1 Dec. 22, 2016

(30) Foreign Application Priority Data

Jun. 17, 2015 (TW) ............................. 104119515 A

(51) Int. Cl.
*H01R 12/71* (2011.01)

(52) U.S. Cl.
CPC .................................. *H01R 12/712* (2013.01)

(58) Field of Classification Search
CPC .. H01R 12/712; H01R 12/714; H01R 12/716; H01R 12/73; H01R 12/737; H01R 12/72; H01R 12/721; H01R 12/722; H01R 12/724; H01R 12/727; H05K 1/117; H05K 1/141; H05K 1/0216; H05K 2201/2036

See application file for complete search history.

(56) References Cited

U.S. PATENT DOCUMENTS

| | | | | | |
|---|---|---|---|---|---|
| 4,241,381 | A | * | 12/1980 | Cobaugh | H05K 7/1457 361/624 |
| 4,949,224 | A | * | 8/1990 | Yamamura | H01L 23/49572 257/E21.511 |
| 5,290,971 | A | * | 3/1994 | Hamaguchi | H01L 23/13 174/250 |
| 5,503,564 | A | * | 4/1996 | Futatsugi | G06K 7/0047 439/153 |
| 5,572,141 | A | * | 11/1996 | Hutton | G01R 1/0416 324/73.1 |

(Continued)

FOREIGN PATENT DOCUMENTS

| | | |
|---|---|---|
| CN | 102548225 B | 3/2015 |
| TW | 201306685 A | 2/2013 |

*Primary Examiner* — Bernarr E Gregory
*Assistant Examiner* — Daniel P Malley, Sr.
(74) *Attorney, Agent, or Firm* — McClure, Qualey & Rodack, LLP

(57) ABSTRACT

An electronic device is provided, which includes a circuit board and a bridge-shaped circuit board structure. The circuit board includes a first circuit board edge, a second circuit board edge, a first coupling unit, and a second coupling portion. The first coupling unit is located on the first circuit board edge. The second coupling unit is located on the second circuit board edge. The bridge-shaped circuit board structure includes a first supporting portion, a second supporting portion, a planar portion, a third coupling unit and a fourth coupling portion. The first supporting portion is disposed on the first planar portion edge. The second supporting portion is disposed on the second planar portion edge. A receiving space is formed between the planar portion and the circuit board.

13 Claims, 7 Drawing Sheets

(56) References Cited

U.S. PATENT DOCUMENTS

| | | | | |
|---|---|---|---|---|
| 5,650,917 | A * | 7/1997 | Hsu | H05K 7/1407 361/727 |
| 5,708,297 | A * | 1/1998 | Clayton | H01L 23/13 257/712 |
| 5,797,757 | A * | 8/1998 | Aoki | H01R 12/73 439/101 |
| 5,865,631 | A * | 2/1999 | Berto | H05K 1/117 439/59 |
| 5,895,278 | A * | 4/1999 | Humphrey | H01R 12/716 439/101 |
| 5,904,581 | A * | 5/1999 | Pope | H01R 12/716 439/74 |
| 5,919,049 | A * | 7/1999 | Petersen | H01R 12/721 439/60 |
| 6,084,780 | A * | 7/2000 | Happoya | H05K 1/141 257/686 |
| 6,188,583 | B1 | 2/2001 | Fendt et al. | |
| 6,238,240 | B1 * | 5/2001 | Yu | H05K 5/0265 439/541.5 |
| 6,285,432 | B1 * | 9/2001 | Phillips | G02F 1/13452 349/149 |
| 6,452,113 | B2 * | 9/2002 | Dibene, II | G06F 1/18 174/260 |
| 6,488,549 | B1 * | 12/2002 | Weller | H01R 13/6485 439/181 |
| 6,494,724 | B1 * | 12/2002 | Bixler | H01R 13/506 439/79 |
| 6,520,802 | B1 * | 2/2003 | Mitra | H01R 13/05 439/541.5 |
| 6,692,271 | B2 * | 2/2004 | Watanabe | H01R 12/716 439/108 |
| 6,911,942 | B2 * | 6/2005 | Fukuda | H01P 1/213 333/204 |
| 7,445,503 | B1 * | 11/2008 | Zhang | H01R 13/41 439/607.01 |
| 7,537,463 | B1 * | 5/2009 | Farole | H01R 12/716 439/495 |
| 9,137,929 | B1 * | 9/2015 | Yang | H01R 12/724 |
| 9,865,935 | B2 * | 1/2018 | Miraftab | H01Q 21/005 |
| 2001/0014546 | A1 * | 8/2001 | Yasufuku | H05K 1/117 439/55 |
| 2003/0080836 | A1 * | 5/2003 | Nagaishi | H01L 23/552 333/247 |
| 2003/0181077 | A1 * | 9/2003 | Rothermel | H01R 13/6471 439/76.1 |
| 2005/0233644 | A1 * | 10/2005 | Bogiel | H01R 12/727 439/630 |
| 2006/0097906 | A1 * | 5/2006 | Heide | G01S 7/032 342/22 |
| 2006/0152406 | A1 * | 7/2006 | Leblanc | G01S 7/032 342/175 |
| 2008/0299796 | A1 * | 12/2008 | Hoshino | H01R 4/028 439/72 |
| 2011/0065297 | A1 * | 3/2011 | Guan | H01R 12/7029 439/155 |
| 2011/0124214 | A1 * | 5/2011 | McKee | H01R 12/721 439/159 |
| 2013/0040476 | A1 * | 2/2013 | Li | H01R 13/639 439/147 |
| 2013/0214964 | A1 * | 8/2013 | Holt | G01S 13/882 342/120 |
| 2014/0145883 | A1 * | 5/2014 | Baks | H01Q 1/2283 343/700 MS |
| 2014/0153201 | A1 * | 6/2014 | Cheng | H05K 1/141 361/748 |
| 2014/0162470 | A1 * | 6/2014 | Fricker | H01R 12/523 439/65 |
| 2014/0244078 | A1 * | 8/2014 | Downey | G05D 1/0055 701/11 |

* cited by examiner

ELECTRONIC DEVICE AND RADAR DEVICE

CROSS REFERENCE TO RELATED APPLICATIONS

This Application claims priority of Taiwan Patent Application No. 104119515, filed on Jun. 17, 2015, the entirety of which is incorporated by reference herein.

BACKGROUND OF THE INVENTION

Field of the Invention

The present invention relates to an electronic device, and in particular to a radar device.

Description of the Related Art

In a conventional microwave radar device, there are two ways to assemble the printed circuit boards: They can be assembled by a board-to-board connector, or they can be integrated into one single circuit board. Conventionally, the dimensions of the printed circuit boards and the height of the board-to-board connector increase the thickness of the radar device. When the radar device is installed, the bumper of the car can interfere with the radar device, causing the radar device to perform poorly.

BRIEF SUMMARY OF THE INVENTION

An electronic device is provided, which includes a circuit board and a bridge-shaped circuit board structure. The circuit board includes a first circuit board edge, a second circuit board edge, a first coupling unit, and a second coupling portion. The first circuit board edge is parallel to the second circuit board edge. The first coupling unit is located on the first circuit board edge. The second coupling unit is located on the second circuit board edge. The bridge-shaped circuit board structure includes a first supporting portion, a second supporting portion, a planar portion, a third coupling unit, and a fourth coupling portion. The planar portion comprises a first planar portion edge and a second planar portion edge. The first planar portion edge is parallel to the second planar portion edge. The first supporting portion is disposed on the first planar portion edge. The second supporting portion is disposed on the second planar portion edge. The third coupling unit is disposed on the first supporting portion. The fourth coupling unit is disposed on the second supporting portion. The third coupling unit is electrically connected to the first coupling unit. The fourth coupling unit is electrically connected to the second coupling unit. The planar portion is parallel to the circuit board. A receiving space is formed between the planar portion and the circuit board.

Utilizing the bridge-shaped circuit board structure, the electronic device of the embodiment of the invention omits the board-to-board joints, and the overall thickness of the electronic device is reduced. In one embodiment, the bridge-shaped circuit board structure is made by blind-etching, and the dimension of the bridge-shaped circuit board structure is accurately controlled. Compared to the conventional art, the electronic device of the embodiment can be installed easily, and is prevented from being interfered with by neighboring structures such as a bumper.

Additionally, in one embodiment, the power converter is disposed on the bridge-shaped circuit board structure, and the noise generated by the power converter is insulated. The power converter is one of the major sources of noise. The bridge-shaped circuit board structure insulates the power integrated circuit from the digital signal processor, and the noise from the power integrated circuit is prevented from interfering with the digital signal processor, and the performance of the electronic device is improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
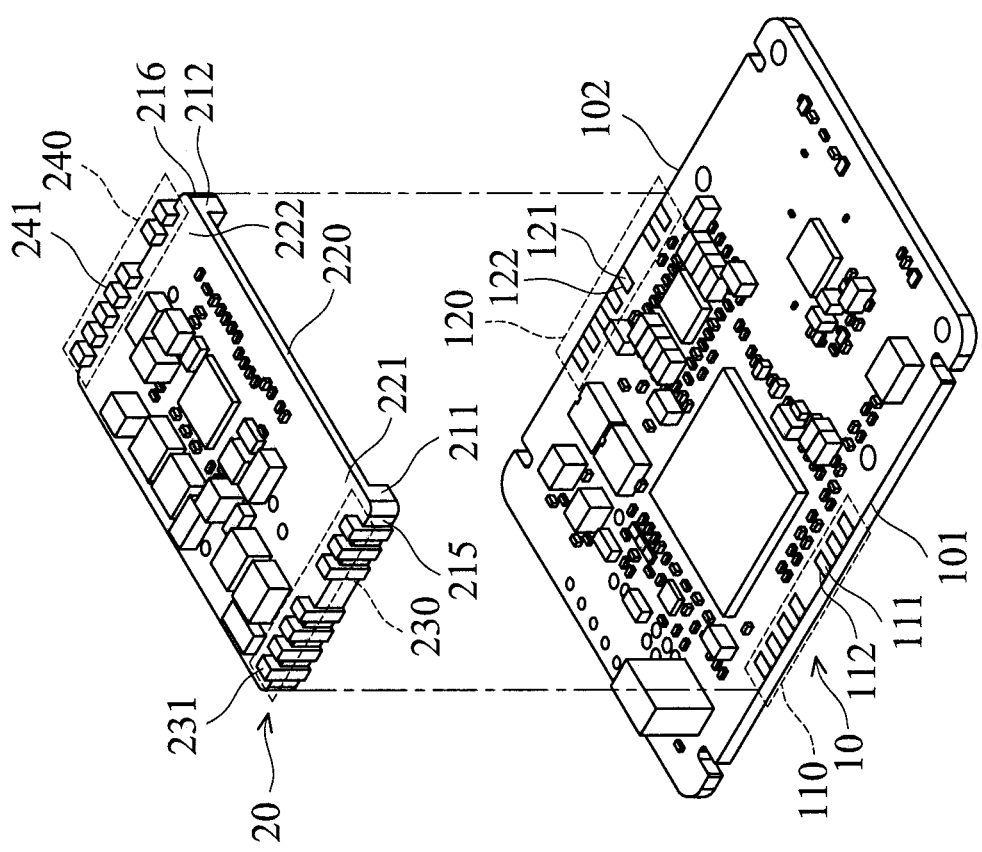
FIG. 1 is an exploded view of an electronic device of an embodiment of the invention.

FIG. 1 is an exploded view of an electronic device 1 of an embodiment of the invention, which includes a circuit board 10 and a bridge-shaped circuit board structure 20. The circuit board 10 includes a first circuit board edge 101, a second circuit board edge 102, a first coupling unit 110 and a second coupling portion 120. The first circuit board edge 101 is parallel to the second circuit board edge 102. The first coupling unit 110 is located on the first circuit board edge 101. The second coupling unit 120 is located on the second circuit board edge 102.

The bridge-shaped circuit board structure 20 includes a first supporting portion 211, a second supporting portion 212, a planar portion 220, a third coupling unit 230 and a fourth coupling portion 240. The planar portion 220 comprises a first planar portion edge 221 and a second planar portion edge 222. The first planar portion edge 221 is parallel to the second planar portion edge 222. The first supporting portion 211 is disposed on the first planar portion edge 221. The second supporting portion 212 is disposed on the second planar portion edge 222. The third coupling unit 230 is disposed on the first supporting portion 211. The fourth coupling unit 240 is disposed on the second supporting portion 212. The first supporting portion 211 is connected to the first coupling unit 110. The third coupling unit 230 is electrically connected to the first coupling unit 110. The second supporting portion 212 is connected to the second coupling unit 120. The fourth coupling unit 240 is electrically connected to the second coupling unit 120.

Figure 2:
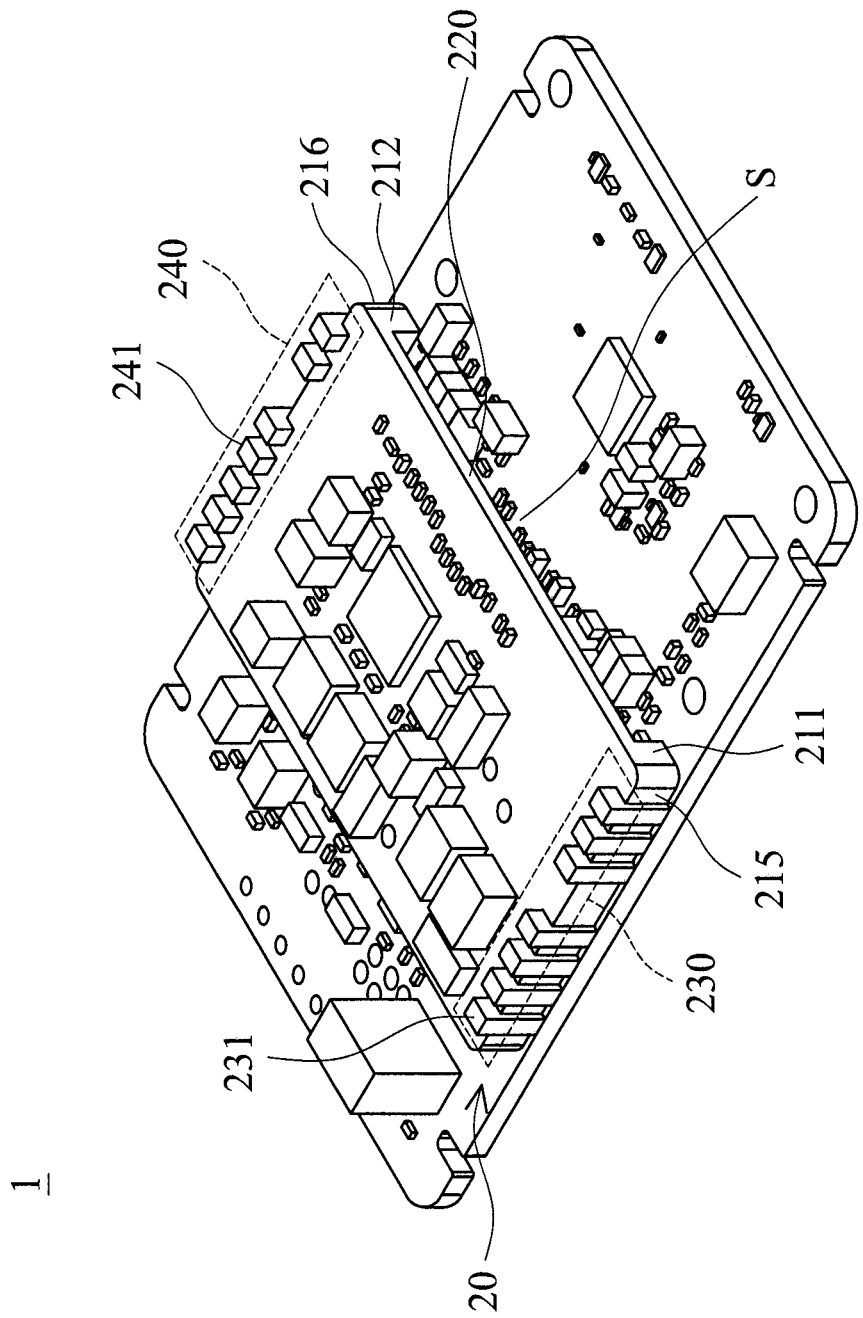
FIG. 2 is an assembled view of the electronic device of the embodiment of the invention.

FIG. 2 is an assembled view of the electronic device 1 of the embodiment of the invention. With reference to FIG. 2, the planar portion 220 is parallel to the circuit board 10 (with reference to FIG. 1). A receiving space S is formed between the planar portion 220 and the circuit board 10. The receiving space S receives the electronic elements of the circuit board 10, and increases the flexibility of the trace design on the surface of the circuit board 10.

Figure 3A:
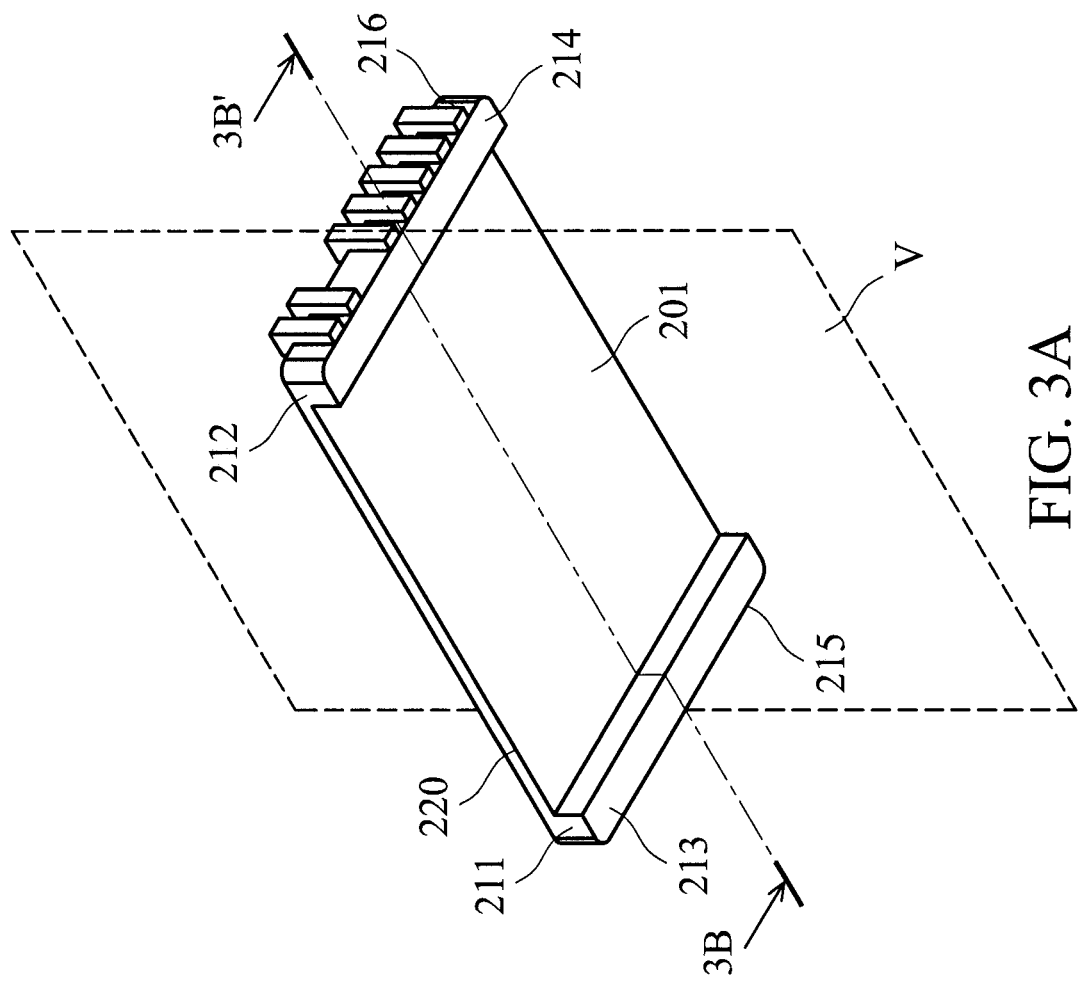
FIG. 3A shows a bridge-shaped circuit board structure of the embodiment of the invention.

With reference to FIG. 3A, in this embodiment, the bridge-shaped circuit board structure 20 has a U-shaped cross section on a vertical plan V. The vertical plane V is perpendicular to the circuit board 10. The first supporting portion 211, the second supporting portion 212 and the planar portion 220 jointly define a slot 201.

In one embodiment, the first supporting portion 211, the second supporting portion 212 and the planar portion 220 of the bridge-shaped circuit board structure 20 are integrally formed. However, the disclosure is not meant to restrict the invention. The supporting portion 211 and the second supporting portion 212 can also be attached the planar portion 220 by glued or other means.

Figure 3B:
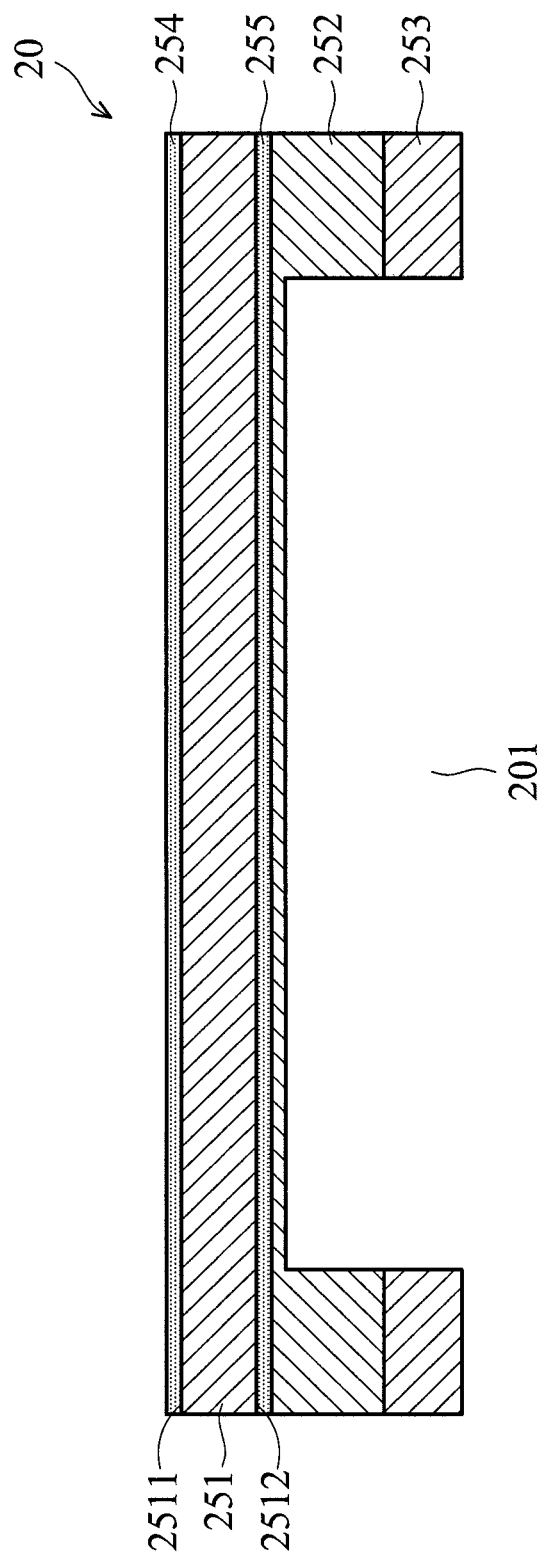
FIG. 3B is a sectional view of along direction 3B-3B' of FIG. 3A, wherein the dimension of FIG. 3B is modified to clearly show the structure of each layer.

FIG. 3B is a sectional view of along direction 3B-3B' of FIG. 3A, wherein the dimension of FIG. 3B is modified to clearly show the structure of each layer. With reference to FIG. 3B, the bridge-shaped circuit board structure 20 comprises a first substrate 251, a prepreg layer 252 and a second substrate 253, wherein the slot 201 passes through the second substrate 253 and extends into the prepreg layer 252. The bridge-shaped circuit board structure 20 further comprises a first wiring layer 254 and a second wiring layer 255. The first substrate 251 comprises a first substrate surface 2511 and a second substrate surface 2512. The first wiring layer 254 is located on the first substrate surface 2511. The second wiring layer 255 is located on the second substrate surface 2512. In one embodiment, the second wiring layer 225 of the bridge-shaped circuit board structure 20 is covered by the prepreg layer 225. Therefore, the second wiring layer 255 is not exposed in the bottom of the slot 201. However, the disclosure is not meant to restrict the invention. The structure of the bridge-shaped circuit board structure 20 can be modified as required, which can be a three-layer structure, a four-layer structure or other structures. In a modified example, the second wiring layer 255 can be exposed in the bottom of the slot 201. In this embodiment, the first substrate layer 251 and the second substrate layer 253 can be made by glass-reinforced epoxy (FR4).

With reference to FIGS. 1 and 3A, the third coupling unit 230 comprises a plurality of first leads 231. The fourth coupling unit 240 comprises a plurality of second leads 241. The first leads 231 extend from the first wiring layer 254 to a first bottom 213 of the first supporting portion 211 to be electrically connected to the first coupling unit 110 (specifically, the first leads 231 extend to the same plane with the first bottom 213 rather than extending to a location above the first bottom 213). The second leads 241 extend from the first wiring layer 254 to a second bottom 214 of the second supporting portion 212 to be electrically connected to the second coupling unit 120 (specifically, the second leads 241 extend to the same plane with the second bottom 214 rather than extending to a location above the second bottom 214).

In this embodiment, the first leads 231 extend on a first lateral surface 215 of the first supporting portion 211, and the second leads 241 extend on the second lateral surface 216 of the second supporting portion 212. In this embodiment, by the design of the first leads 231 extending on the first lateral surface 215 and the second leads 241 extending on the second lateral surface 216, the space of the slot 201 is increased. However, the disclosure is not meant to restrict the invention. In one embodiment, the first leads 231 can be embedded in the first supporting portion 211, and is exposed at the first bottom 213. The second leads 241 can be embedded in the second supporting portion 212, and is exposed at the second bottom 214.

With reference to FIG. 1, the first coupling unit 110 comprises a plurality of first contacts 111, a plurality first notches 112 are formed on the first circuit board edge 101. The first contacts 111 are respectively located in the first notches 112. The second coupling unit 120 comprises a plurality of second contacts 121, a plurality second notches 122 are formed on the second circuit board edge 102. The second contacts 121 are respectively located in the second notches 122. The first leads 231 are respectively electrically connected to the first contacts 111. The second leads 241 are respectively electrically connected to the second contacts 121. In one embodiment, the first leads 231 are electrically connected to the first contacts 111 by welding, and the second leads 241 are electrically connected to the second contacts 121 by welding.

Figure 4:
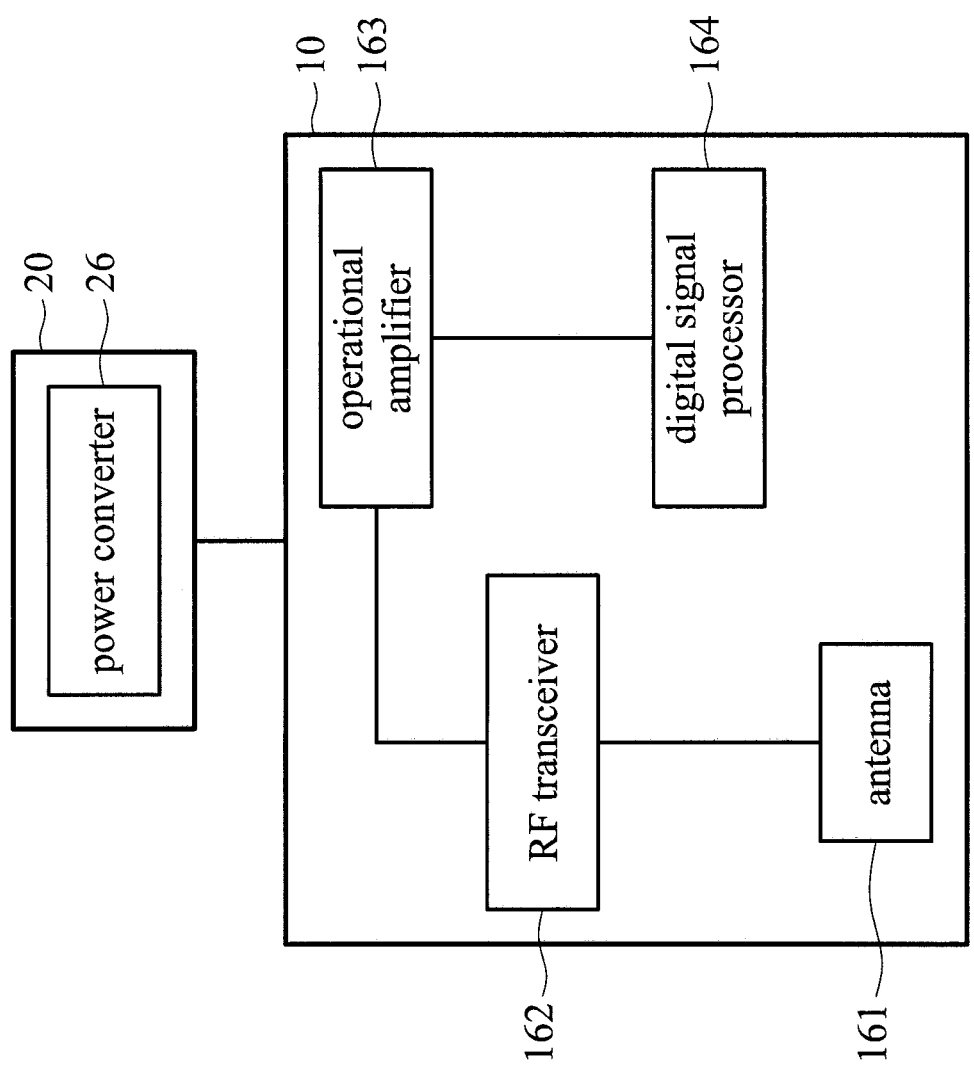
FIG. 4 is a block diagram of the electronic device of the embodiment of the invention.

With reference to FIG. 4, the electronic device further comprises a power converter 26 disposed on the bridge-shaped circuit board structure. In one embodiment, the electronic device further comprises an antenna 161, an RF transceiver (high-band transceiver) 162, an operational amplifier 163 and a digital signal processor (base-band high-speed processor) 164. The antenna 161 is coupled to the RF transceiver 162, the RF transceiver 162 is coupled to the operational amplifier 163, and the digital signal processor 164 is coupled to the operational amplifier 163. The antenna 161, the RF transceiver (high-band transceiver) 162, the operational amplifier 163 and the digital signal processor (base-band high-speed processor) 164 are disposed on the circuit board 10. In one embodiment, the digital signal processor 164 communicates with a car through a local area network transceiver. In other applications, when the electronic device is utilized in a radar system, the band of the RF transceiver is about 24 GHz. When the electronic device is utilized to a local area network system, the band of the RF transceiver is about 2.4 GHz or 5 GHz. Commonly, the frequency of the baseband is lower than 1 GHz. However, the disclosure is not meant to restrict the invention. In one embodiment, the operational frequency of the digital signal processor 164 may greater than 1 GHz, for example, between 2 GHz-4 GHz, wherein the electronic device is utilized to the radar system, the band of the RF transceiver is about 24 GHz. In another embodiment, when the electronic device is utilized in the local area network system (IEEE 802.11), the band of the RF transceiver is about 2.4 GHz or 5 GHz.

Figure 5:
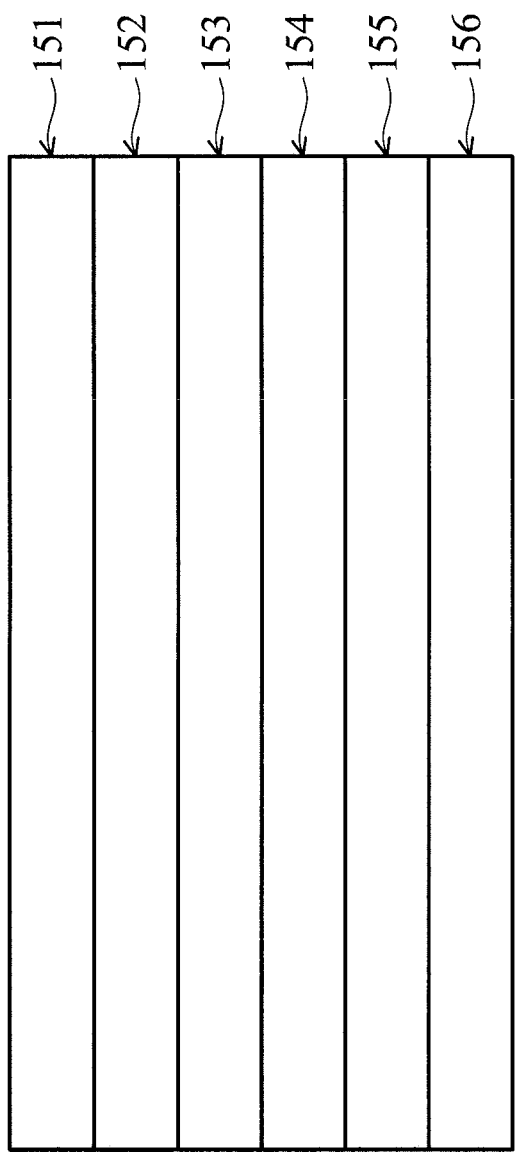
FIG. 5 shows the structure of the layers of the circuit board of the embodiment of the invention.

With reference to FIG. 5, as the structure of the circuit board 10, in one embodiment, the circuit board 10 has six layers. The first layer 151 and the sixth layer 156 are made of high-band low-loss material, such as ROGERS R04350. The third layer 153 is made of epoxy fiberglass (FR4). The first layer 151 comprises an antenna. The second layer 152 comprises a reference ground layer of the antenna. The third layer 153 comprises the trace of the digital signals. The fourth layer 154 comprises a power layer.

The fifth layer 155 comprises a reference ground layer of a bottom high-band trace. The sixth layer 156 comprises an integrated circuit and a mixed layer of high-band signal and digital signal. In one embodiment, the six layers are not stacked symmetrically.

Figure 6:
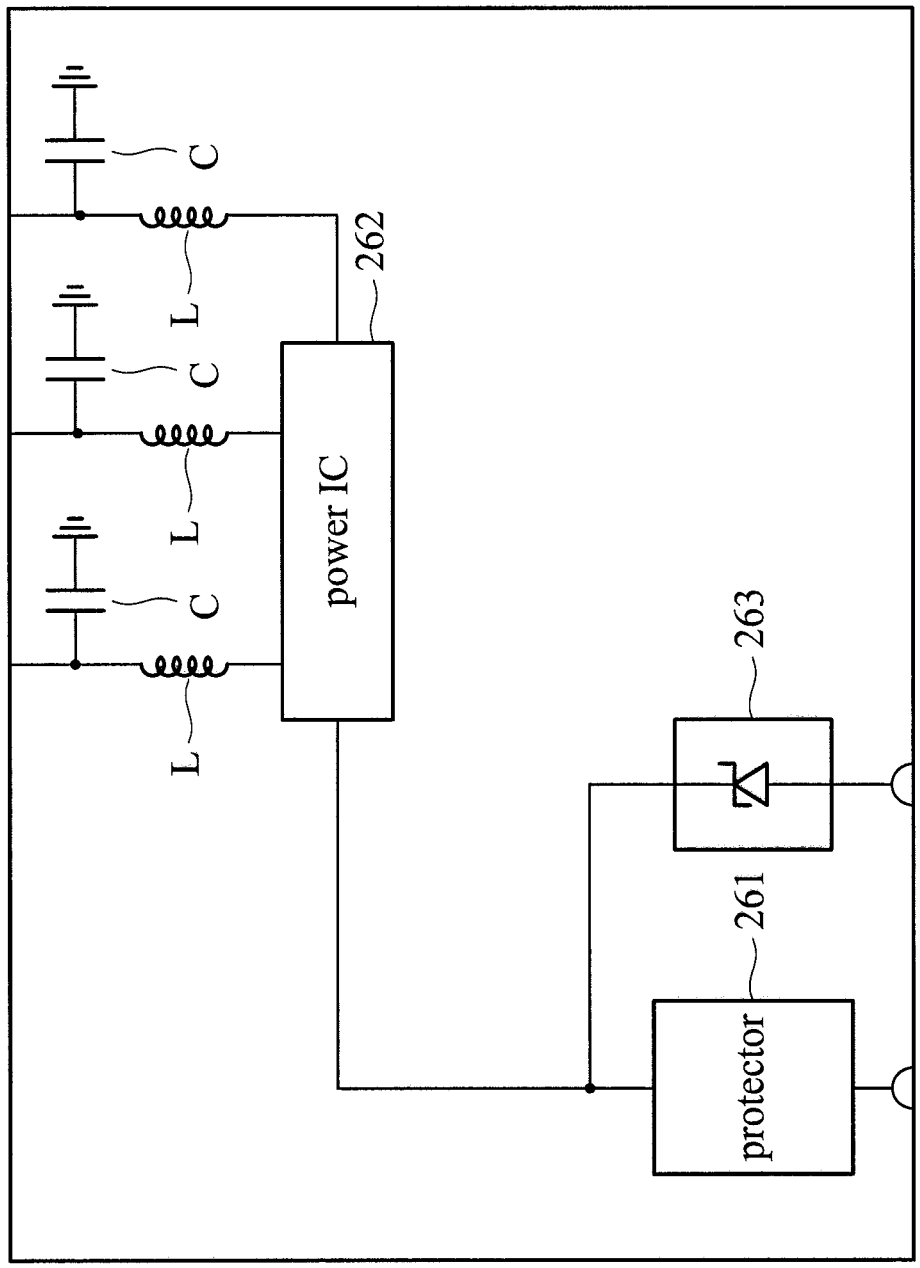
FIG. 6 shows a block diagram of a power convertor of the embodiment of the invention.

With reference to FIG. 6, in one embodiment, the power converter 26 comprises a protector 261, an inductor L, a power integrated circuit 262, a capacitor C and a Zener diode 263. An external power supply couples the power integrated circuit 262 through the protector 261 and the Zener diode 263. The power provided by the power integrated circuit 262 is outputted after filtered by the inductor L and the capacitor C.

Utilizing the bridge-shaped circuit board structure, the electronic device of the embodiment of the invention omits the board-to-board joints, and the overall thickness of the electronic device is reduced. In one embodiment, the bridge-shaped circuit board structure is made by blind-etching, and the dimension of the bridge-shaped circuit board structure is accurately controlled. Compared to the conventional art, the electronic device of the embodiment can be installed easily, and is prevented from being interfered with by neighboring structures such as a bumper.

Additionally, in one embodiment, the power converter is disposed on the bridge-shaped circuit board structure. Because the bridge-shaped circuit board structure is disposed between the power converter and the components of the circuit board, the noise generated by the power converter is insulated. The power converter is one of the major noise sources. The bridge-shaped circuit board structure insulates the power integrated circuit of the power converter from the digital signal processor, and the noise from the power integrated circuit is prevented from interfering with the digital signal processor, and the performance of the electronic device is improved.

In the embodiments of the invention, the leads extend on the lateral surfaces of the supporting portions, the input/output port of the RF transceiver and the input/output port of the system and the trace of the RF transceiver can be concentrated arranged to improve the integrity of the signal.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
an RF transceiver;
an antenna, coupled to the RF transceiver;
an operational amplifier, coupled to the RF transceiver;
a digital signal processor, coupled to the operational amplifier;
a power converter;
a circuit board, comprising a first circuit board edge, a second circuit board edge, a first coupling unit, and a second coupling portion, wherein the first circuit board edge is parallel to the second circuit board edge, the first coupling unit is located on the first circuit board edge, and the second coupling unit is located on the second circuit board edge, wherein the first coupling unit comprises a plurality of first contacts, and the second coupling unit comprises a plurality of second contacts; and
a U-shaped circuit board structure, comprising a first supporting portion, a second supporting portion, a planar portion, a third coupling unit, and a fourth coupling portion, wherein the planar portion comprises a first planar portion edge and a second planar portion edge, the first planar portion edge is parallel to the second planar portion edge, the first supporting portion is disposed on the first planar portion edge, the second supporting portion is disposed on the second planar portion edge, the third coupling unit is disposed on the first supporting portion, the fourth coupling unit is disposed on the second supporting portion, the third coupling unit is electrically connected to the first coupling unit, the fourth coupling unit is electrically connected to the second coupling unit, the planar portion is parallel to the circuit board, and a receiving space is formed between the planar portion and the circuit board, wherein the power converter is disposed on the U-shaped circuit board structure, such that the U-shaped circuit board structure is interposed between the power converter and the digital signal processor;
wherein the third coupling unit comprises a plurality of first leads, the fourth coupling unit comprises a plurality of second leads, the first leads extend on a first lateral surface of the first supporting portion to a first end surface of the first supporting portion to be connected to the first contacts, and the second leads extend on the second lateral surface of the second supporting portion to a second end surface of the second supporting portion to be connected to the second contacts,
wherein the power converter is disposed on the U-shaped circuit board structure, and the antenna, the RF transceiver, the digital signal processor and the operational amplifier are disposed on the circuit board.

2. The electronic device as claimed in claim 1, wherein the first supporting portion, the second supporting portion and the planar portion jointly define a slot.

3. The electronic device as claimed in claim 2, wherein the U-shaped circuit board structure comprises a first substrate, a prepreg layer and a second substrate, wherein the slot passes through the second substrate and extends into the prepreg layer.

4. The electronic device as claimed in claim 3, wherein the U-shaped circuit board structure further comprises a first wiring layer and a second wiring layer, the first substrate comprises a first substrate surface and a second substrate surface, the first wiring layer is located on the first substrate surface, and the second wiring layer is located between the second substrate surface and the first substrate.

5. The electronic device as claimed in claim 4, wherein the second wiring layer is covered by the prepreg layer in the slot.

6. The electronic device as claimed in claim 4, wherein the first leads extend from the first wiring layer to the first end surface of the first supporting portion to be electrically connected to the first coupling unit, and the second leads extend from the first wiring layer to the second end surface of the second supporting portion to be electrically connected to the second coupling unit.

7. A radar device, comprising:
an RF transceiver;
an antenna, coupled to the RF transceiver;
an operational amplifier, coupled to the RF transceiver;

a digital signal processor, coupled to the operational amplifier;

a power converter;

a circuit board, comprising a first circuit board edge, a second circuit board edge, a first coupling unit and a second coupling portion, wherein the first circuit board edge is parallel to the second circuit board edge, the first coupling unit is located on the first circuit board edge, and the second coupling unit is located on the second circuit board edge, wherein the first coupling unit comprises a plurality of first contacts, and the second coupling unit comprises a plurality of second contacts; and a U-shaped circuit board structure, comprising a first supporting portion, a second supporting portion, a planar portion, a third coupling unit and a fourth coupling portion, wherein the planar portion comprises a first planar portion edge and a second planar portion edge, the first supporting portion is disposed on the first planar portion edge, the second supporting portion is disposed on the second planar portion edge, the third coupling unit is disposed on the first supporting portion, the fourth coupling unit is disposed on the second supporting portion, the first supporting portion is disposed on the first coupling unit, the third coupling unit is electrically connected to the first coupling unit, the second supporting portion is disposed on the second coupling unit, the fourth coupling unit is electrically connected to the second coupling unit, the planar portion is parallel to the circuit board, and a receiving space is formed between the planar portion and the circuit board, wherein the power converter is disposed on the U-shaped circuit board structure, such that the U-shaped circuit board structure is interposed between the power converter and the digital signal processor;

wherein the third coupling unit comprises a plurality of first leads, the fourth coupling unit comprises a plurality of second leads, the first leads extend on a first lateral surface of the first supporting portion to a first end surface of the first supporting portion to be connected to the first contacts, and the second leads extend on the second lateral surface of the second supporting portion to a second end surface of the second supporting portion to be connected to the second contacts, wherein the power converter is disposed on the U-shaped circuit board structure, and the antenna, the RF transceiver, the digital signal processor and the operational amplifier are disposed on the circuit board.

8. The radar device as claimed in claim 7, wherein the first supporting portion, the second supporting portion and the planar portion jointly define a slot.

9. The radar device as claimed in claim 8, wherein the U-shaped circuit board structure comprises a first substrate, a prepreg layer and a second substrate, wherein the slot passes through the second substrate and extends into the prepreg layer.

10. The radar device as claimed in claim 9, wherein the U-shaped circuit board structure further comprises a first wiring layer and a second wiring layer, the first substrate comprises a first substrate surface and a second substrate surface, the first wiring layer is located on the first substrate surface, the second wiring layer is located between the second substrate surface and the first substrate.

11. The radar device as claimed in claim 10, wherein the first leads extend from the first wiring layer to the first end surface of the first supporting portion to be electrically connected to the first coupling unit, and the second leads extend from the first wiring layer to the second end surface of the second supporting portion to be electrically connected to the second coupling unit.

12. The electronic device as claimed in claim 1, wherein the circuit board is a multi-layer board, with at least one layer being a high band low-loss material.

13. The electronic device as claimed in claim 7, wherein the circuit board is a multi-layer board, with at least one layer being a high-band low-loss material.

* * * * *